US012644780B2

(12) United States Patent
Yang

(10) Patent No.: US 12,644,780 B2
(45) Date of Patent: Jun. 2, 2026

(54) TEMPERATURE DETECTION SYSTEM

(71) Applicant: HERMES TESTING SOLUTIONS INC., Hsinchu City (TW)

(72) Inventor: Chi-Ming Yang, Hsinchu City (TW)

(73) Assignee: HERMES TESTING SOLUTIONS INC., Hsinchu City (TW)

( * ) Notice: Subject to any disclaimer, the term of this patent is extended or adjusted under 35 U.S.C. 154(b) by 320 days.

(21) Appl. No.: 18/469,563

(22) Filed: Sep. 19, 2023

(65) Prior Publication Data

US 2025/0044164 A1      Feb. 6, 2025

(30) Foreign Application Priority Data

Aug. 4, 2023    (TW) .................................. 112129264

(51) Int. Cl.
*G01K 7/18* (2006.01)
*G01K 1/02* (2021.01)
*G01K 1/16* (2006.01)
*H10P 72/00* (2026.01)
*H10P 74/00* (2026.01)

(52) U.S. Cl.
CPC .............. *G01K 7/18* (2013.01); *G01K 1/026* (2013.01); *G01K 1/16* (2013.01); *H10P 72/00* (2026.01); *H10P 74/00* (2026.01)

(58) Field of Classification Search
CPC . G01K 7/18; G01K 1/026; G01K 1/16; H01L 21/67; H01L 22/00
See application file for complete search history.

(56) References Cited

U.S. PATENT DOCUMENTS

| | | | | | |
|---|---|---|---|---|---|
| 5,833,824 | A | * | 11/1998 | Benton | G01N 27/414 204/417 |
| 9,831,193 | B1 | * | 11/2017 | Jackson | H10W 42/121 |
| 2002/0100316 | A1 | * | 8/2002 | James | G01F 1/6845 73/204.26 |
| 2004/0012404 | A1 | * | 1/2004 | Feder | G01R 31/2874 324/750.07 |
| 2004/0169249 | A1 | * | 9/2004 | Parsons | H01C 7/022 374/E7.018 |
| 2009/0166794 | A1 | * | 7/2009 | Mowry | G01K 1/14 438/54 |
| 2009/0219043 | A1 | * | 9/2009 | Nakayama | G01R 31/2889 324/762.05 |
| 2010/0300201 | A1 | * | 12/2010 | Ge | B81B 7/0048 216/33 |
| 2011/0267598 | A1 | * | 11/2011 | Hjort | G01K 11/3206 385/12 |
| 2014/0139246 | A1 | * | 5/2014 | Chuang | G01R 31/2874 374/178 |
| 2014/0291677 | A1 | * | 10/2014 | Le Neel | G01N 27/223 438/49 |
| 2018/0058943 | A1 | * | 3/2018 | Ge | G01K 7/01 |
| 2018/0266908 | A1 | * | 9/2018 | Yamamoto | G01L 9/00 |

(Continued)

*Primary Examiner* — Nathaniel T Woodward
*Assistant Examiner* — Philip L Cotey
(74) *Attorney, Agent, or Firm* — JCIPRNET

(57) ABSTRACT

A temperature detection system including a wafer, a plurality of sensing modules, and a probe is provided. The wafer has a plurality of dies. The sensing modules are adjacent to the dies, and each of the sensing modules includes a temperature sensor and a plurality of pads. The pads are electrically connected to the temperature sensor. The sensing modules transmit detection signals through the probe.

10 Claims, 4 Drawing Sheets

(56)         References Cited

U.S. PATENT DOCUMENTS

| | | | |
|---|---|---|---|
| 2019/0346312 A1* | 11/2019 | Romig | H01C 1/034 |
| 2021/0183668 A1* | 6/2021 | Cagle | H10P 72/0434 |
| 2022/0319966 A1* | 10/2022 | Tuncer | G01K 1/08 |
| 2022/0326746 A1* | 10/2022 | Mason | G06F 1/181 |
| 2023/0004310 A1* | 1/2023 | Kondo | G06F 3/0619 |
| 2023/0017047 A1* | 1/2023 | Jackson | H10W 42/121 |
| 2023/0138475 A1* | 5/2023 | Tuncer | G01K 7/01 |
| | | | 374/163 |
| 2023/0260864 A1* | 8/2023 | Kondapuram | G05D 23/1917 |
| | | | 713/2 |
| 2024/0044856 A1* | 2/2024 | Sajja | G01N 33/0031 |

* cited by examiner

TEMPERATURE DETECTION SYSTEM

CROSS-REFERENCE TO RELATED APPLICATION

This application claims the priority benefit of Taiwan application no. 112129264, filed on Aug. 4, 2023. The entirety of the above-mentioned patent application is hereby incorporated by reference herein and made a part of this specification.

BACKGROUND

Technical Field

The disclosure relates to a temperature detection system.

Description of Related Art

An existing approach for temperature detection on a wafer typically relies on wirings to connect temperature sensors on the wafer to a data collection module, so as to gather temperature information from the wafer. However, as the quantity of wirings increases together with an increase in the number of the temperature sensors, and in this conventional approach, the capacity of the data collection module collecting data is constrained, it is unlikely to effectively increase the number of the temperature sensors on the wafer. Accordingly, a region which can be detected is restricted, and thus the detection flexibility is diminished.

SUMMARY

The disclosure provides a temperature detection system with an improved detection flexibility.

According to an embodiment of the disclosure, a temperature detection system including a wafer, a plurality of sensing modules, and a probe is provided. The wafer has a plurality of dies. The sensing modules are adjacent to the dies, and each of the sensing modules includes a temperature sensor and a plurality of pads. The pads are electrically connected to the temperature sensor. The sensing modules transmit detection signals through the probe.

In an embodiment of the disclosure, the pads include a plurality of sets of the pads having different pitches, and one of the sets of the pads is configured to be in direct contact with the probe.

In an embodiment of the disclosure, one portion of the sets of the pads is arranged in a first direction, and the other portion of the sets of the pads is arranged in a second direction perpendicular to the first direction.

In an embodiment of the disclosure, a pitch change in the one portion of the sets of the pads is the same as a pitch change in the other portion of the sets of the pads.

In an embodiment of the disclosure, the sets of the pads surround corner locations of the dies corresponding to the sets of the pads.

In an embodiment of the disclosure, the dies and the sensing modules are configured in a one-on-one manner.

In an embodiment of the disclosure, the temperature sensor is a resistance temperature detector (RTD).

In an embodiment of the disclosure, the RTD is a platinum resistance sensor.

In an embodiment of the disclosure, the wafer is a silicon dioxide wafer.

In an embodiment of the disclosure, the temperature sensor is soldered to a surface of the wafer.

In light of the foregoing, in the temperature detection system provided in one or more embodiments of the disclosure, through the combined design of the sensing modules and the probe, the layout space for additional wiring may be saved, and meanwhile a relatively large amount of data may still be collected. Thereby, the sensing modules may be configured on a plurality of locations to be detected on the wafer according to actual demands, so as to effectively increase the number of the temperature sensors on the wafer, expand the region that can be detected, and ensure an improved detection flexibility.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
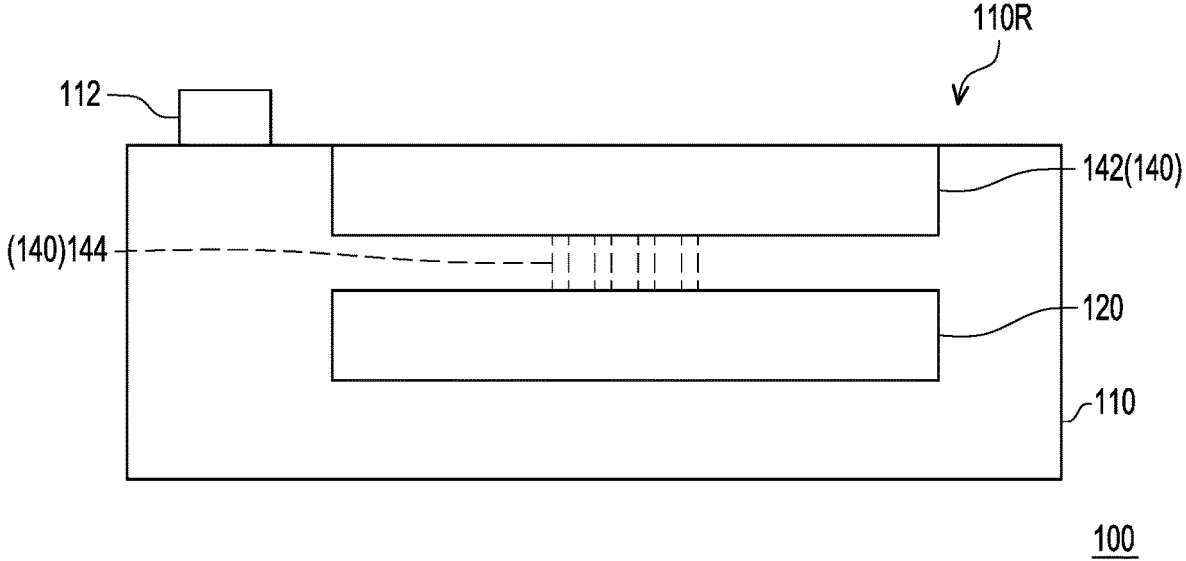
FIG. 1 is a schematic view illustrating a temperature detection device including a temperature detection system according to some embodiments of the disclosure.

In the following detailed description, for purposes of explanation and not limitation, exemplary embodiments disclosing specific details are set forth to provide a thorough understanding of various principles of the disclosure. However, it should be apparent to people with ordinary skills in the art that the disclosure may be practiced in other embodiments that depart from the specific details disclosed herein. Furthermore, descriptions of well-known devices, methods, and materials may be omitted so as not to obscure the description of various principles of the disclosure.

The exemplary embodiments of the disclosure will be fully described below with reference to the drawings, but the disclosure may also be implemented in many different forms and should not be construed as being limited to the embodiments described herein. In the drawings, for clarity, a relative size, a thickness, and a location of each region, portion, and/or layer may not be necessarily drawn to scale, and some components may be omitted.

Unless otherwise defined, all terms (including technical and scientific terms) used herein have the same meanings as commonly understood by people with ordinary skills in the art.

Figure 2:
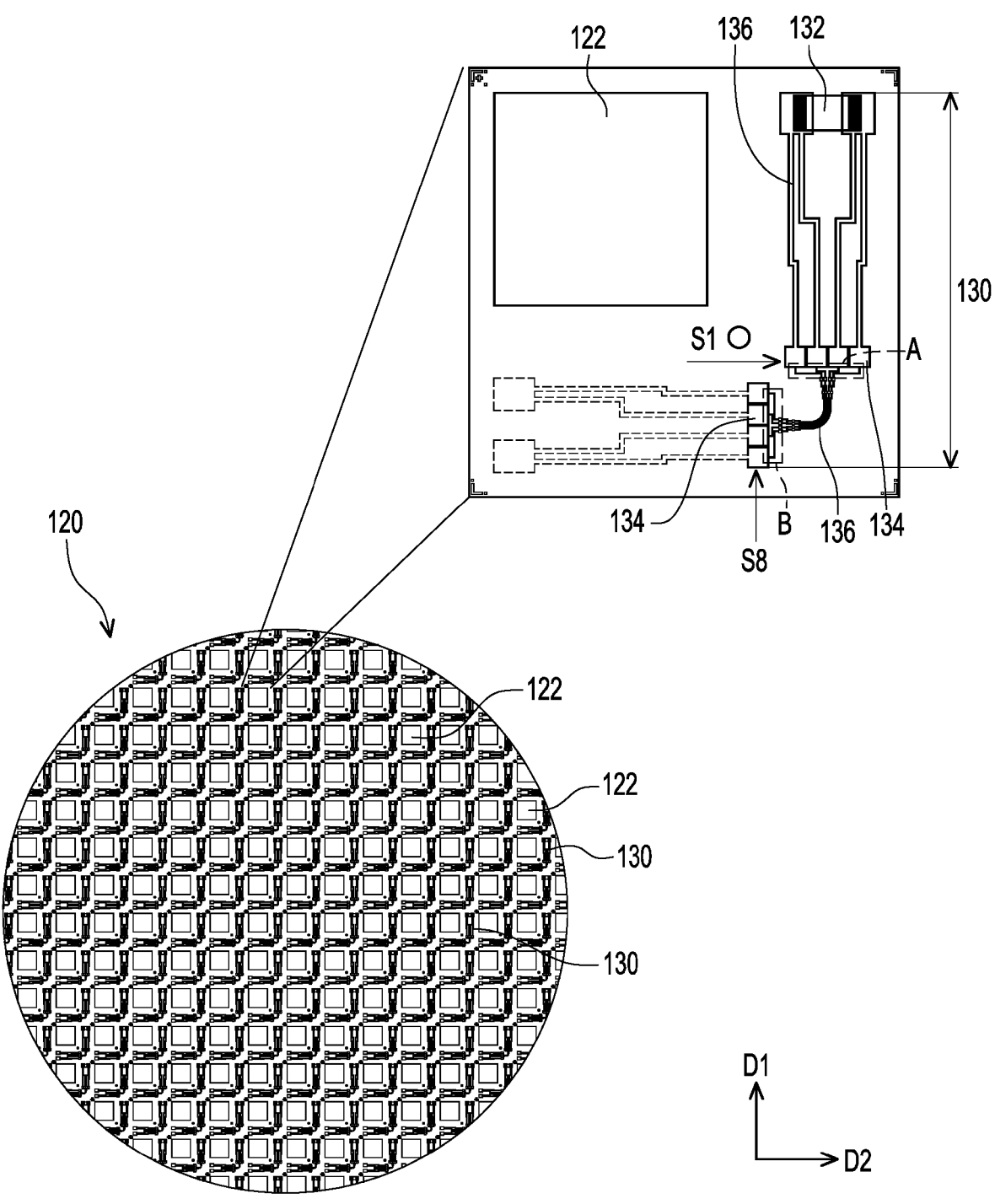
FIG. 2 is a schematic view illustrating a wafer of a temperature detection system according to some embodiments of the disclosure.
Figure 3:
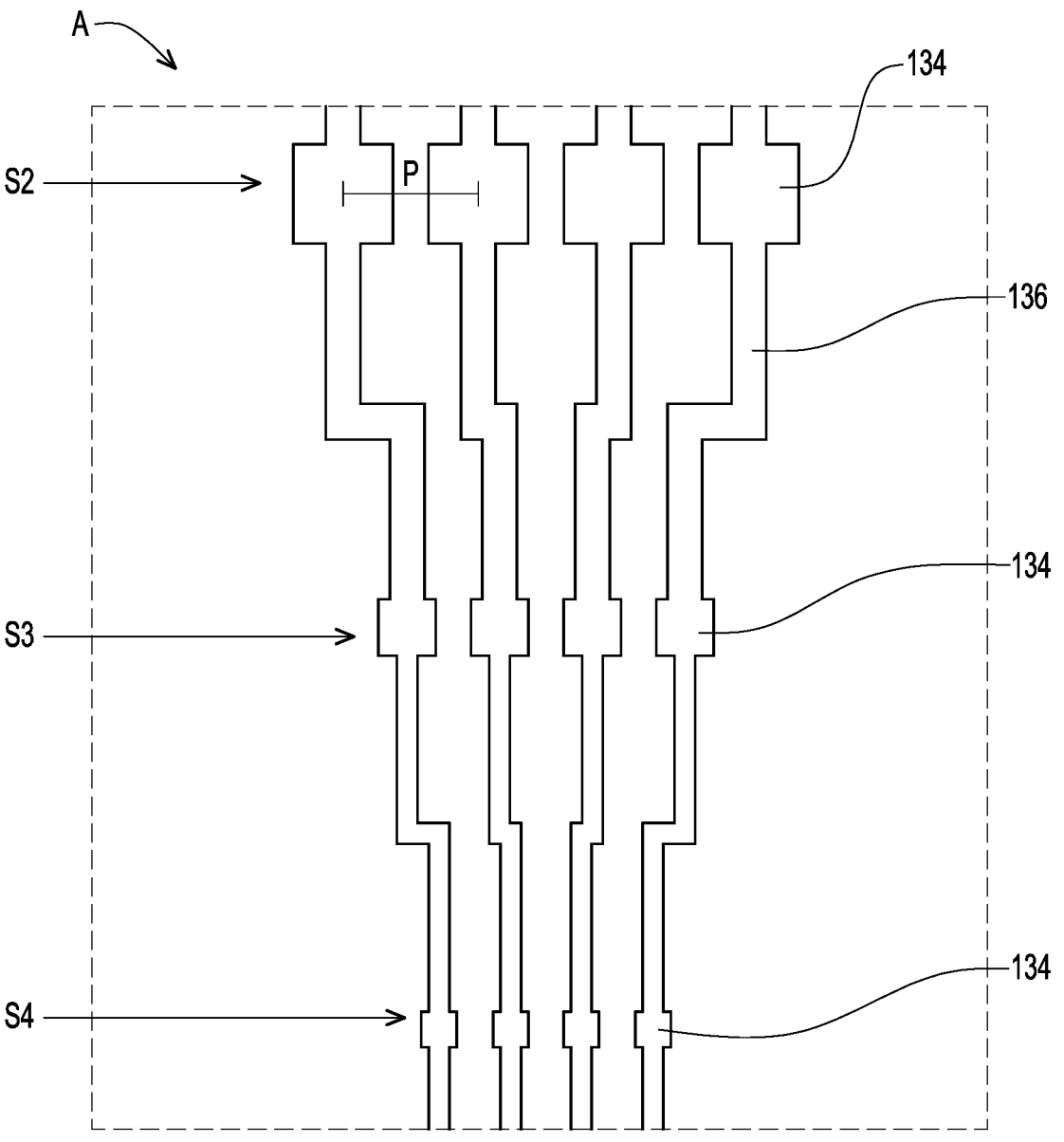
FIG. 3 is a schematic enlarged view illustrating a region A depicted in FIG. 2.
Figure 4:
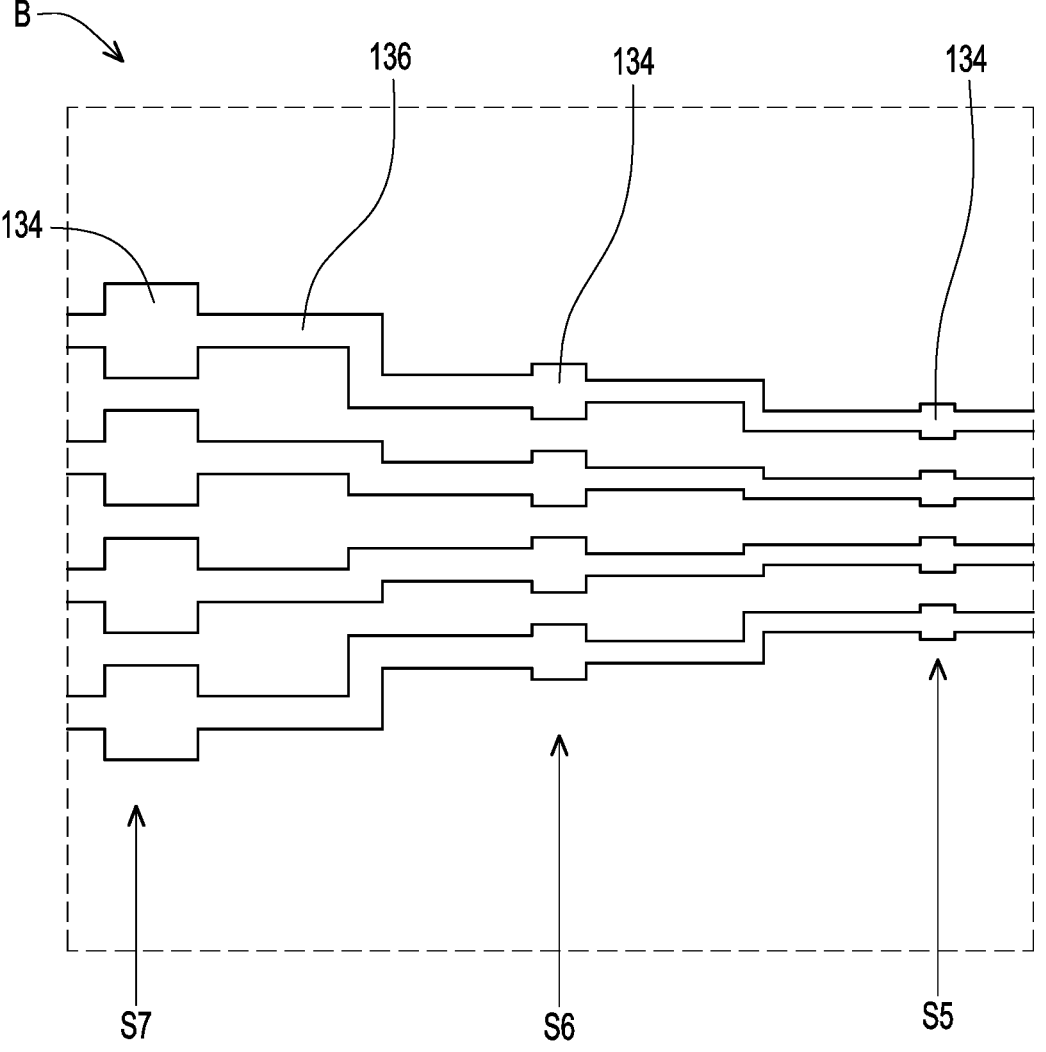
FIG. 4 is a schematic enlarged view illustrating a region B depicted in FIG. 2.

FIG. 1 is a schematic view illustrating a temperature detection device including a temperature detection system according to some embodiments of the disclosure. FIG. 2 is a schematic view illustrating a wafer of a temperature detection system according to some embodiments of the disclosure. FIG. 3 is a schematic enlarged view illustrating a region A depicted in FIG. 2. FIG. 4 is a schematic enlarged view illustrating a region B depicted in FIG. 2.

With reference to FIG. 1 to FIG. 4, in this embodiment, a temperature detection device 100 includes a carrier device 110 and a temperature detection system, and the temperature detection system includes a wafer 120, a plurality of sensing modules 130, and a probe 144. Specifically, the wafer 120 may be arranged in the carrier device 110 and carried by the carrier device 110 for performing detections, and the probe 144 is located in a top region 110R of the carrier device 110. Here, the probe 144 may originate from a probe device 140, and the carrier device 110 and the type of the probe device 140 may assume any suitable type; for instance, the carrier device 110 may be a prober, and the probe device 140 may be a probe card or a suitable probe station, which should however not be interpreted as imposing any limitation in the disclosure. As long as the carrier device 110 and the probe device 140 are capable of facilitating connections with the sensing modules 130 and are configured to conduct temperature detections, the carrier device 110 and the probe device 140 are encompassed within the scope of protection in this disclosure. On the other hand, the wafer 120 and the probe device 140 may also be attached to the carrier device 110 in any appropriate manner; for instance, although the probe device 140 is embedded in the carrier device 110 as shown in FIG. 1, the probe device 140 may also be arranged on the carrier device 110, and may or may not be fixed onto the carrier device 110.

In particular, the wafer 120 has a plurality of dies 122, the sensing modules 130 are adjacent to the dies 122, and each of the sensing modules 130 includes a temperature sensor 132 and a plurality of pads 134, where the pads 134 are electrically connected to the temperature sensor 132. In addition, the sensing modules 130 transmit detection signals through the probe 144. Accordingly, the combined design of the sensing modules 130 and the probe 144 allows the temperature detection system provided in this embodiment to facilitate saving the layout space of additional wiring while also collecting a relatively large amount of data. Thereby, the sensing modules 130 may be disposed at a plurality of to-be-detected locations (such as locations where the temperature is abnormal) on the wafer 120 according to actual demands, thus effectively increasing the number of the temperature sensor 132 arranged on the wafer 120 expanding the region that can be detected, and further ensuring an improved detection flexibility. Here, the dies 122 may be of any suitable type and size (e.g., 20000 micrometers by 20000 micrometers), which should however not be interpreted as imposing any limitation in the disclosure.

In this embodiment, as shown in FIG. 1, when the probe device 140 is a probe card, the probe device 140 may include a body 142 and a plurality of probes 144, which should however not be interpreted as imposing any limitation in the disclosure. In an embodiment not shown, when the probe device 140 is another suitable probe station, the number of the body and the number of the probe may be plural (e.g., two), and the bodies and the probes may be configured and operated in an appropriate manner, which will not be further described hereinafter.

In some embodiments, the temperature detection device 100 further includes a tester 112 to collect and/or analyze corresponding temperature data (such as signals transmitted by the probe 144). The tester 112 may be additionally configured on the carrier device 110 or built in the carrier device 110, which should however not be interpreted as imposing any limitation in the disclosure.

In some embodiments, each 12-inch wafer 120 may be equipped with 149 temperature sensors 132. Therefore, compared to the number of the temperature sensors arranged on the existing 12-inch wafer which can only be equipped with 13 temperature sensors, the number of the temperature sensors 132 arranged on the wafer 120 provided in this embodiment may be significantly increased, which should however not be interpreted as imposing any limitation in the disclosure. For instance, the dies 122 and the sensing modules 130 are configured in a one-on-one manner, so the amount of the temperature sensors 132 arranged on the wafer 120 may be adjusted according to the size of the wafer 120 (such as 6 inches, 8 inches, etc.) and the number of the dies 122 on the wafer 120.

In some embodiments, as shown in FIG. 2 to FIG. 4, the pads 134 include a plurality of sets of pads with different pitches, such as a first set S1 of pads, a second set S2 of pads, a third set S3 of pads, a fourth set S4 of pads, a fifth set S5 of pads, a sixth set S6 of pads, a seventh set S7 of pads, and an eighth set S8 of pads. One of the sets of the pads is configured to be in direct contact with the probe 144. Thereby when the probe device 140 is a probe card, even if the probe cards may have different specifications, the same sensing module 130 may be applied for detection. That is, there is no need to manufacture the sensing modules 130 having the specifications corresponding to the different specifications of the probe cards. Therefore, the temperature detection device 100 provided in this embodiment has a multi-card-in-one design, so as to effectively reduce detection costs and simplify detection steps, which should however not be interpreted as imposing any limitation in the disclosure. Here, the pitch is, for instance, a distance P between the center points of the adjacent pads 134 (as shown in FIG. 3).

Besides, one portion of the sets of the pads (such as the first set S1 of pads, the second set S2 of pads, the third set S3 of pads, and the fourth set S4 of pads) are arranged in a first direction D1, and the other portion of the sets of the pads (such as the fifth set S5 of pads, the sixth set S6 of pads, the seventh set S7 of pads, and the eighth set S8 of pads) are arranged in a second direction D2 perpendicular to the first direction D1. In other words, the sets of the pads (such as the first set S1 of pads, the second set S2 of pads, the third set S3 of pads, the fourth set S4 of pads, the fifth set S5 of pads, the sixth set S6 of pads, the seventh set S7 of pads, and the eighth set S8 of pads) may surround corner locations of the corresponding dies 122, as shown in FIG. 2. Thereby, the pads 134 for detection may be present in different directions. Under said design, when the wafer 120 is rotated, the probe 144 is not required to be correspondingly rotated or moved, so as to increase the detection speed, which should however not be interpreted as imposing any limitation in the disclosure.

In some embodiments, a pitch change in one portion of the sets of the pads (such as the first set S1 of pads, the second set S2 of pads, the third set S3 of pads, and the fourth set S4 of pads) is the same as a pitch change in the other portion of the sets of the pads (such as the fifth set S5 of pads, the sixth set S6 of pads, the seventh set S7 of pads, and the eighth set S8 of pads). For instance, in the first direction D1, the first set S1 of pads, the second set S2 of pads, the third set S3 of pads, and the fourth set S4 of pads follow a hierarchical order based on their pitches, progressing from larger to smaller; in the second direction D2, the fifth set S5 of pads, the sixth set S6 of pads, the seventh set S7 of pads, and the eighth set S8 of pads follow a hierarchical order based on their pitches, progressing from larger to smaller. The pitch in the first set S1 of pads and the eighth set S8 of pads is, for instance, 1000 micrometers, the pitch in the second set S2 of pads and the seventh set S7 of pads is, for instance, 190 micrometers, the pitch in the third set S3 of pads and the sixth set S6 of pads is, for instance, 130 micrometers, and the pitch in the fourth set S4 of pads and the fifth set S5 of pads is, for instance, 100 micrometers, which should however not be interpreted as imposing any limitation in the disclosure; the numerical values of the pitches may be larger or smaller depending on the actual design requirements.

In some embodiments, each of the pads 134 in each set of pads can have the same size, and the size and pitch of each set of pads correspond. For instance, the first set S1 of pads and the eighth set S8 of pads are, for instance, square pads with a side length of 950 micrometers, the second set S2 of pads and the seventh set S7 of pads are, for instance, square pads with a side length of 140 micrometers, the third set S3 of pads and the sixth set S6 of pads are, for instance, square pads with a side length of 80 micrometers, and the fourth set S4 of pads and the fifth set S5 of pads are, for instance, square pads with a side length of 50 micrometers, which should however not be interpreted as imposing any limitation in the disclosure; the numerical values of the sizes of the pads may be larger or smaller depending on the actual design requirements, and the shape of the pads may also be adjusted depending on the actual design requirements.

In some embodiments, the pads 134 in any one of the first set S1 of pads, the second set S2 of pads, the third set S3 of pads, and the fourth set S4 of pads are arranged in the second direction D2, and the pads 134 in any one of the fifth set S5 of pads, the sixth set S6 of pads, the seventh set S7 of pads, and the eighth set S8 of pads are arranged in the first direction D1. In other words, the arrangement direction of the pads in each set of pads may be perpendicular to the arrangement direction of the sets of pads, which should however not be interpreted as imposing any limitation in the disclosure.

In some embodiments, the temperature sensor 132 in each sensing module 130 may be selectively arranged only in one direction. For instance, in FIG. 2, the temperature sensors 132 shown in solid lines are arranged corresponding to the first set S1 of pads in the first direction D1, while the temperature sensors 132 shown in dashed lines are arranged corresponding to the eighth set S8 of pads in the second direction D2. Here, it is likely to selectively place one of the temperature sensors 132 shown in solid lines and the temperature sensors 132 shown in dashed lines on the wafer 120.

In some embodiments, the temperature sensor 132 is a resistance temperature detector (RTD) with high precision. Therefore, when the temperature on the wafer 120 changes, different resistances may be correspondingly generated. As such, temperature information may be obtained through resistance conversion. The RTD may be a platinum (Pt) resistance sensor, which should however not be interpreted as imposing any limitation in the disclosure. Here, the wafer 120 equipped with the sensing modules 130 may be referred to as a RTD wafer.

In some embodiments, the electrical connections between the temperature sensors 132 and the pads 134 and the sets of pads may be achieved by applying a four-wire connection method. Thereby, the RTDs acting as the temperature sensors 132 may facilitate improving the measurement accuracy, the temperature range to be detected, and the detection flexibility. In addition, the fourth set S4 of pads and the fifth set S5 of pads having the smallest and identical pitch may be electrically connected by a wiring 136, so that the pads 134 in different directions may communicate, which should however not be interpreted as imposing any limitation in the disclosure.

Although eight sets of pads are exemplarily provided this embodiment for explanation, not that the number of sets of pads should not be interpreted as imposing any limitation in the disclosure. That is, no matter whether more than or less than four sets of pads are arranged in one direction, as long as the pads are electrically connected to the temperature sensors, and the sensing modules including the pads and temperature sensors transmit the detection signals through the probe, the description in this embodiment is encompassed in the scope of protection in the disclosure.

In some embodiments, the Pt resistance sensor may be a PT-100 element or a PT-1000 element. When the PT-100 element is at 0° C., the temperature sensor 132 correspondingly obtains a reading of 100 ohms, and the resistance increases by 0.385 ohms for each increase of 1° C. When the PT-1000 element is at 0° C., the temperature sensor 132 correspondingly obtains a reading of 1000 ohms, and the resistance increases by 3.85 ohms for each increase of 1° C. Here, when the temperature detection device 100 provided in this embodiment uses these two temperature sensing elements, the measurable temperature range is −55° C. to 175° C., the measurement accuracy is −55° C. to 100° C.±0.86° C. and 100° C. to 175° C.±1.24° C., which is suitable for preventive maintenance (PM), repair, and mass production.

Note that the type of the Pt resistance sensor is not limited in the disclosure and may be selected according to actual design demands. For instance, since the sensing modules 130 have sensing patterns (such as the pads 134 and the wiring 136), contact resistance (e.g., less than 5 ohms) is generated when the probe 144 is applied for contact measurement. If the impact of the contact resistance is not significant, the PT-100 element which can be easily calibrated may be used. If the impact of the contact resistance is significant, the PT-1000 element may be selected to more effectively reduce the adverse impact of the contact resistance on measurement.

In some embodiments, there is a distance of at least 1 centimeter between the temperature sensors 132 and the adjacent dies 122, and the distance serves as a safe space for the probe 144 to move. As such, the probability of damaging surrounding elements when the probe 144 is in operation may be lessened, which should however not be interpreted as imposing any limitation in the disclosure.

In some embodiments, the temperature detection system may also serve to measure the electrical performance of the wafer 120, which should however not be interpreted as imposing any limitation in the disclosure.

A detection method applying the temperature detection device 100 is described hereinafter. The sensing modules 130 to be measured are moved under the probe 144. The probe 144 may then be used to directly contact the pads 134 in the sensing modules 130 to obtain data from the temperature sensors 132. For instance, in the four-wire connection method provided in this embodiment, when the probe device 140 is a probe card, four probes 144 simultaneously contact part or all of the pads 134 in the same sets of pads. In other embodiments, when the probe device 140 is a probe station, the probe device 140 may have two probe seats, each of which has two probes to separately or simultaneously contact the pads 134 in the same sets of pads to form a loop. The data obtained from the temperature sensor 132 may be optionally transmitted to the tester 112 for collection to complete the detection steps. As such, the breadth of the layout of the sensing modules 130 and the high mobility of the probe 144 may contribute to achieving a flexible detection of regions to be detected on the wafer 120.

In some embodiments, the wafer 120 is a silicon dioxide wafer, and therefore the pads 134 and the wiring 136 may be directly fabricated on the wafer 120 through photolithography processes, such as exposure, development, and etching. Thereby, the pads 134 may be accurately formed at the desired locations. Here, the temperature sensor 132 is, for instance, soldered to a surface of the wafer 120, where the soldering process is, for instance, a surface mount technology (SMT) process, which should however not be interpreted as imposing any limitation in the disclosure.

To sum up, in the temperature detection system provided in one or more embodiments of the disclosure, through the combined design of the sensing modules and the probe, the layout space for additional wiring may be saved, and meanwhile a relatively large amount of data may still be collected. Thereby, the sensing modules may be configured on a plurality of locations to be detected on the wafer according to actual demands, so as to effectively increase the number of the temperature sensors arranged on the wafer, expand the region that can be detected, and ensure an improved detection flexibility.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A temperature detection system, comprising:
   a wafer, having a plurality of dies;
   a plurality of sensing modules, adjacent to the dies and disposed on a surface of the wafer, wherein each of the sensing modules comprises:

a temperature sensor; and
   a plurality of pads, electrically connected to the temperature sensor; and
   a probe, wherein the sensing modules transmit detection signals through the probe.

2. The temperature detection system according to claim 1, wherein the pads comprise a plurality of sets of the pads having different pitches, and one of the sets of the pads is configured to be in direct contact with the probe.

3. The temperature detection system according to claim 2, wherein one portion of the sets of the pads is arranged in a first direction, and the other portion of the sets of the pads is arranged in a second direction perpendicular to the first direction.

4. The temperature detection system according to claim 3, wherein a pitch change in the one portion of the sets of the pads is the same as a pitch change in the other portion of the sets of the pads.

5. The temperature detection system according to claim 2, wherein the sets of the pads surround corner locations of the dies corresponding to the sets of the pads.

6. The temperature detection system according to claim 1, wherein the dies and the sensing modules are configured in a one-on-one manner.

7. The temperature detection system according to claim 1, wherein the temperature sensor is a resistance temperature detector.

8. The temperature detection system according to claim 7, wherein the resistance temperature detector is a platinum resistance sensor.

9. The temperature detection system according to claim 1, wherein the wafer is a silicon dioxide wafer.

10. The temperature detection system according to claim 1, wherein the temperature sensor is soldered to the surface of the wafer.

* * * * *